US006882559B2

(12) United States Patent
Masui et al.

(10) Patent No.: US 6,882,559 B2
(45) Date of Patent: Apr. 19, 2005

(54) FERROELECTRIC MEMORY SUPPLYING PREDETERMINED AMOUNT OF DIRECT-CURRENT BIAS ELECTRICITY TO FIRST AND SECOND BIT LINES UPON READING DATA FROM MEMORY CELL

(75) Inventors: Shoichi Masui, Kawasaki (JP); Yadollah Eslami, Apt. # 1006, 35 Charles St. W., Toronto, Ontario (CA), M4Y 1R6; Ali Sheikholeslami, 52 Pharmacy Av., Toronto, Ontario (CA), M1L 3E5

(73) Assignees: Fujitsu Limited, Kawasaki (JP); Yadollah Eslami, Ontario (CA); Ali Sheikholeslami, Ontario (CA)

( * ) Notice: Subject to any disclaimer, the term of this patent is extended or adjusted under 35 U.S.C. 154(b) by 0 days.

(21) Appl. No.: 10/453,934

(22) Filed: Jun. 4, 2003

(65) Prior Publication Data

US 2004/0017713 A1 Jan. 29, 2004

(30) Foreign Application Priority Data

Jun. 4, 2002 (JP) ........................................ 2002-162651

(51) Int. Cl.[7] .............................................. G11C 11/22
(52) U.S. Cl. .................................. 365/145; 365/189.04
(58) Field of Search ................................ 365/145, 149, 365/203, 207, 189.09, 189.04

(56) References Cited

U.S. PATENT DOCUMENTS

| 5,621,680 | A | 4/1997 | Newman et al. |
| 5,754,466 | A | 5/1998 | Arase |
| 5,940,316 | A | 8/1999 | Koike |
| 5,978,250 | A | 11/1999 | Chung et al. |
| 6,058,049 | A | 5/2000 | Kye et al. |
| 6,233,170 | B1 | 5/2001 | Yamada |
| 6,411,540 | B1 * | 6/2002 | Ashikaga ..................... 365/145 |
| 6,434,038 | B1 * | 8/2002 | Ohno ........................ 365/145 |
| 2002/0006053 | A1 | 1/2002 | Murakuki |

FOREIGN PATENT DOCUMENTS

| EP | 1 021 4488 | 8/1998 |
| EP | 1 058 268 A2 | 12/2000 |

OTHER PUBLICATIONS

Hirano, et al.; "2–V/100–ns 1T/1C Nonvolatile Ferroelectric Memory Architecture with Bitline–Driven Read Scheme and Nonrelaxation Reference cell"; IEEE Journal of Solid–State Circuits, May 1997; vol. 32, No. 5.

Koike, et al. "A 60–ns 1–Mb Nonvolatile Ferroelectric Memory with a Nondriven Cell Plate Line Write/Read Scheme" IEEE Journal of Solid State Circuits, Nov. 1996; vol. 31, No. 11.

Patent Abstracts of Japan, vol. 1997, No. 7, Jul. 31, 1997 & JP 09 063281 A, Mar. 7, 1997.

Patent Abstracts of Japan, vol. 2002, No. 5, May 3, 2002 & Jp 2002 015563 A, Jan. 18, 2002.

* cited by examiner

*Primary Examiner*—Thong Q. Le
(74) *Attorney, Agent, or Firm*—Arent Fox PLLC

(57) ABSTRACT

Upon reading data from a memory cell, first and second bit lines are precharged beforehand at a grounding voltage. Then, at a start of the reading, a predetermined amount of direct-current bias electricity is supplied to the first and second bit lines for a predetermined period of time by a direct-current bias electricity supply circuit. Thereafter, a sense amplifier is activated.

6 Claims, 13 Drawing Sheets

FERROELECTRIC MEMORY SUPPLYING PREDETERMINED AMOUNT OF DIRECT-CURRENT BIAS ELECTRICITY TO FIRST AND SECOND BIT LINES UPON READING DATA FROM MEMORY CELL

BACKGROUND OF THE INVENTION

1. Field of the Invention

The present invention generally relates to a ferroelectric memory, and more particularly, to a ferroelectric memory using as a storage medium a ferroelectric capacitor composed of a ferroelectric material.

2. Description of the Related Art

Conventionally proposed ferroelectric memories include a ferroelectric memory comprising a 1T1C-type memory cell using one transistor and one ferroelectric capacitor, and a ferroelectric memory comprising a 2T2C-type memory cell using two transistors and two ferroelectric capacitors. These ferroelectric memories are popular in separate markets: the former ferroelectric memory is popular in a market where a high density and a large capacity are required, and the latter ferroelectric memory is popular in a market where a high reliability is required.

FIG. 1 is a circuit diagram showing a main part of an example of the conventional ferroelectric memory comprising the 2T2C-type memory cell. FIG. 1 shows a word line WL, bit lines BL and XBL, a plate line PL, and a 2T2C-type memory cell MC. The 2T2C-type memory cell MC includes ferroelectric capacitors FC1 and FC2 forming storage media, and nMOS transistors M1 and M2 forming access transistors.

FIG. 1 also shows sense amplifier drive voltage lines SAP and SAN, and a differential sense amplifier SA. The differential sense amplifier SA includes pMOS transistors M3 and M4 forming pull-up elements, and nMOS transistors M5 and M6 forming pull-down elements.

Besides, in FIG. 1, "0" indicates a downward polarization of the ferroelectric capacitor, and "1" indicates an upward polarization of the ferroelectric capacitor. In FIG. 2, "0" and "1" are represented by positions A and B, respectively, in a hysteresis loop of the ferroelectric capacitor. When the bit lines BL and XBL are maintained at a grounding voltage VSS, and the plate line PL is driven from the grounding voltage VSS to a power supply voltage VDD, conditions of "0" and "1" correspond respectively to a case where an effective capacitance of the ferroelectric capacitor is small, and a case where an effective capacitance of the ferroelectric capacitor is large.

FIG. 3 is a waveform diagram exemplifying a readout operation when the conventional ferroelectric memory shown in FIG. 1 adopts a plate-line drive readout method. In an example shown in FIG. 3, the memory cell MC is selected in a case where data "0" is stored in the ferroelectric capacitor FC1, and data "1" is stored in the ferroelectric capacitor FC2.

In this readout method, prior to a readout (Read) period, a potential of the word line WL is VSS so that the nMOS transistors M1 and M2 are OFF. Also, a potential of the sense amplifier drive voltage line SAP is VSS, and a potential of the sense amplifier drive voltage line SAN is VDD so that the sense amplifier SA is inactive. Further, a potential of the plate line PL is VSS, and the bit lines BL and XBL are precharged at VSS.

In the readout period, the potential of the word line WL is made VDD so that the nMOS transistors M1 and M2 are turned ON; thereafter, the potential of the plate line PL is made VDD. Consequently, the potentials of the bit lines BL and XBL rise slightly so that a differential voltage occurs between the bit lines BL and XBL.

In this example, since the ferroelectric capacitor FC1 stores the data "0", the ferroelectric capacitor FC1 does not cause a polarization inversion even when the potential of the plate line PL is pulled up from VSS to VDD; accordingly, the effective capacitance of the ferroelectric capacitor FC1 becomes small. On the other hand, the ferroelectric capacitor FC2 causes a polarization inversion when the potential of the plate line PL is pulled up from VSS to VDD; accordingly, the effective capacitance of the ferroelectric capacitor FC2 becomes large. Consequently, the potential of the bit line BL becomes smaller than the potential of the bit line XBL.

Then, the potential of the sense amplifier drive voltage line SAP is made VDD, and the potential of the sense amplifier drive voltage line SAN is made VSS so that the sense amplifier SA is activated. At this point, since the potential of the bit line BL is smaller than the potential of the bit line XBL, a differential operation of the sense amplifier SA causes the pMOS transistor M3 to be OFF, the pMOS transistor M4 to be ON, the nMOS transistor M5 to be ON, and the nMOS transistor M6 to be OFF. Accordingly, the bit line BL is pulled down to VSS, and the bit line XBL is pulled up to VDD.

In this state, a write-back (Write-Back) period follows the readout period. In the write-back period, the potential of the plate line PL is pulled down to VSS, and a write-back is performed to the ferroelectric capacitors FC1 and FC2. When the write-back period finishes, the potential of the word line WL is made VSS so that the nMOS transistors M1 and M2 are turned OFF. Also, the potential of the sense amplifier drive voltage line SAP is made VSS, and the potential of the sense amplifier drive voltage line SAN is made VDD so that the sense amplifier SA is deactivated. Further, the bit lines BL and XBL are precharged at VSS.

As described above, in the plate-line drive readout method exemplified in FIG. 3, the plate line PL is driven upon performing a readout; and based on a difference between the effective capacitances of the ferroelectric capacitors FC1 and FC2 having different data, a differential voltage is generated between the bit lines BL and XBL, thereby performing the readout.

FIG. 4 is a waveform diagram exemplifying a readout operation when the conventional ferroelectric memory shown in FIG. 1 adopts a plateline non-drive readout method (H. Koike et al., Journal of Solid-State Circuits, vol.31, no.11, pp. 1625–1634, 1997). In an example shown in FIG. 4, data "0" is stored in the ferroelectric capacitor FC1, and data "1" is stored in the ferroelectric capacitor FC2.

In this readout method, the potential of the plate line PL is fixed at VDD/2. Prior to a readout (Read) period, the potential of the word line WL is VSS so that the nMOS transistors M1 and M2 are OFF. Besides, the potentials of the sense amplifier drive voltage lines SAP and SAN are VDD/2, and the potentials of the bit lines BL and XBL are VDD/2.

In the readout period, the potential of the sense amplifier drive voltage line SAP is made VSS, and the potential of the sense amplifier drive voltage line SAN is made VDD so that the sense amplifier SA is deactivated. Also, the potentials of the bit lines BL and XBL are made VSS. Thereafter, the potential of the word line WL is made VDD so that the nMOS transistors M1 and M2 are turned ON. Consequently, the potentials of the bit lines BL and XBL rise slightly so that a differential voltage occurs between the bit lines BL and XBL (the potential of the bit line BL being smaller than the potential of the bit line XBL).

Then, the potential of the sense amplifier drive voltage line SAP is made VDD, and the potential of the sense amplifier drive voltage line SAN is made VSS so that the sense amplifier SA is activated. Consequently, the potential of the bit line BL is pulled down to VSS, and the potential of the bit line XBL is pulled up to VDD. In this state, a write-back (Write-Back) period follows the readout period. Before the write-back period finishes, the potentials of the sense amplifier drive voltage lines SAP and SAN are made VDD/2, and subsequently, the potentials of the bit lines BL and XBL are made VDD/2. When the write-back period finishes, the potential of the word line WL is made VSS.

As described above, in the plate-line non-drive readout method exemplified in FIG. 4, the plate line PL is not driven, but is fixed at VDD/2, upon performing a readout; and based on the potentials of the bit lines BL and XBL precharged at VSS, and a charge sharing between storage nodes S1 and S2 (shown in FIG. 1) set at VDD/2, a readout is performed, thereby shortening a readout access time.

FIG. 5 is a waveform diagram exemplifying a readout operation when the conventional ferroelectric memory shown in FIG. 1 adopts a bit-line drive readout method (H. Hirano et al., Journal of Solid-State Circuits, vol.32, no.5, pp.649–654, 1997). In an example shown in FIG. 5, data "0" is stored in the ferroelectric capacitor FC1, and data "1" is stored in the ferroelectric capacitor FC2.

In this readout method, prior to a readout (Read) period, the potential of the word line WL is VSS so that the nMOS transistors M1 and M2 are OFF. Also, the potential of the sense amplifier drive voltage line SAP is VSS, and the potential of the sense amplifier drive voltage line SAN is VDD so that the sense amplifier SA is inactive. Further, the potential of the plate line PL is VSS, and the potentials of the bit lines BL and XBL are VSS. Immediately before the readout period, the bit lines BL and XBL are precharged at VDD.

Then, in the readout period, the potential of the word line WL is made VPP (a voltage boosted from VDD) so that the nMOS transistors M1 and M2 are turned ON. Consequently, the potentials of the bit lines BL and XBL rise slightly so that a differential voltage occurs between the bit lines BL and XBL (the potential of the bit line BL being smaller than the potential of the bit line XBL).

Thereafter, the potential of the sense amplifier drive voltage line SAP is made VDD, and the potential of the sense amplifier drive voltage line SAN is made VSS so that the sense amplifier SA is activated. Consequently, the potential of the bit line BL is pulled down to VSS, and the potential of the bit line XBL is pulled up to VDD.

In this state, a write-back (Write-Back) period follows the readout period. In the write-back period, the potential of the plate line PL is pulled down to VSS, up to VDD, and down to VSS, and a write-back is performed to the ferroelectric capacitors FC1 and FC2. When the write-back period finishes, the potential of the word line WL is made VSS so that the nMOS transistors M1 and M2 are turned OFF. Also, the potential of the sense amplifier drive voltage line SAP is made VSS, and the potential of the sense amplifier drive voltage line SAN is made VDD so that the sense amplifier SA is deactivated. Further, the bit lines BL and XBL are made VSS.

As described above, in the bit-line drive readout method exemplified in FIG. 5, the plate line PL is not driven upon performing a readout, but the bit lines BL and XBL are precharged at VDD; and according to a difference between discharge amounts of the bit lines BL and XBL which originates from a difference between the equivalent capacitances of the ferroelectric capacitors FC1 and FC2, the readout is performed. Therefore, although the plate line PL needs to be driven upon performing a write-back of data after the readout, an access time of the readout can be shortened in comparison with the plate-line drive readout method exemplified in FIG. 3.

Since the plate-line drive readout method exemplified in FIG. 3 includes driving the plate line PL upon performing a readout which involves a large CR delay, the plate-line drive readout method exemplified in FIG. 3 has a problem of a prolonged readout access time.

Since the plate-line non-drive readout method exemplified in FIG. 4 impresses only VDD/2 to the ferroelectric capacitors FC1 and FC2, a data writing cannot be performed with the full power supply voltage VDD, which does not conform to low voltage conditions. Additionally, after a data writing is performed, the storage nodes S1 and S2 are discharged to the grounding voltage VSS by leakage currents of diodes parasitic on the nMOS transistors M1 and M2; thus, the storage nodes S1 and S2 need to be refreshed periodically. These problems make serious obstacles for an actual operation of a memory, which hinders a utilization of this method.

Since the bit-line drive readout method exemplified in FIG. 5 includes precharging the bit lines BL and XBL at VDD before a readout, the boosted voltage VPP needs to be impressed to the word line WL. Therefore, the bit-line drive readout method necessitates a circuit for boosting VDD to VPP, thereby causing a problem of an enlarged circuit area, and power consumption.

SUMMARY OF THE INVENTION

It is a general object of the present invention to provide an improved and useful ferroelectric memory in which the above-mentioned problems are eliminated.

A more specific object of the present invention is to provide a ferroelectric memory capable of reading data from a memory cell at high speed without supplying a boosted voltage to a word line, and accordingly, without necessitating a boosting circuit, thereby avoiding an increase in circuit scale.

In order to achieve the above-mentioned objects, there is provided according to one aspect of the present invention a ferroelectric memory including a memory cell, first and second bit lines corresponding to the memory cell, a sense amplifier corresponding to the first and second bit lines, and a direct-current bias electricity supply circuit supplying a predetermined amount of direct-current bias electricity to the first and second bit lines for a predetermined period of time upon reading data from the memory cell.

According to the present invention, upon reading data from the memory cell, the first and second bit lines are precharged beforehand at a grounding voltage. Then, at a start of the reading, the predetermined amount of direct-current bias electricity is supplied to the first and second bit lines for the predetermined period of time by the direct-current bias electricity supply circuit. Thereafter, the sense amplifier is activated. Thereby, the data can be read from the memory cell.

Other objects, features and advantages of the present invention will become more apparent from the following detailed description when read in conjunction with the accompanying drawings.

DETAILED DESCRIPTION OF THE PREFERRED EMBODIMENTS

Figure 1:
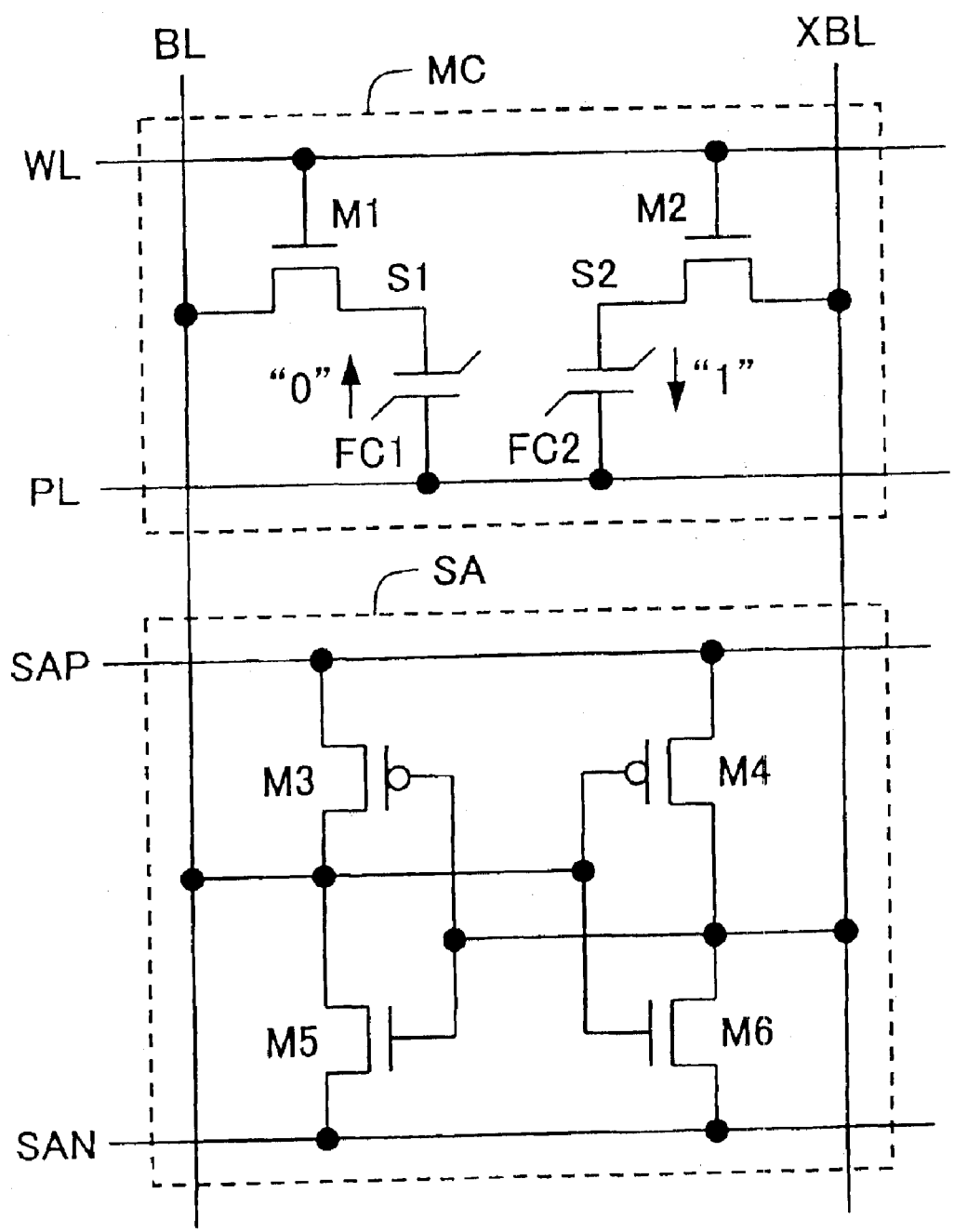
FIG. 1 is a circuit diagram showing a main part of an example of a conventional ferroelectric memory comprising a 2T2C-type memory cell.
Figure 2:
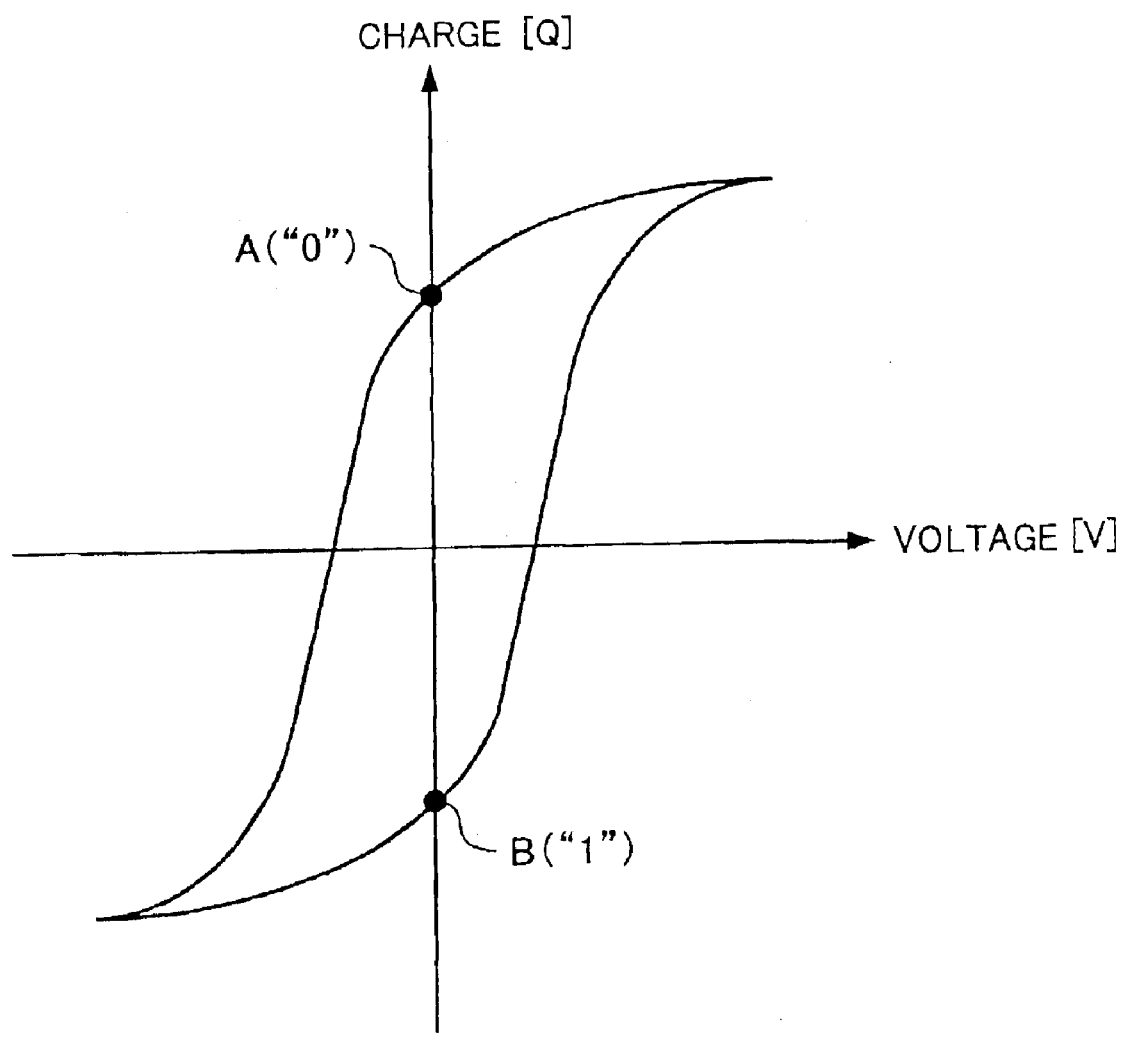
FIG. 2 is a graph showing a hysteresis loop of a ferroelectric capacitor.
Figure 3:
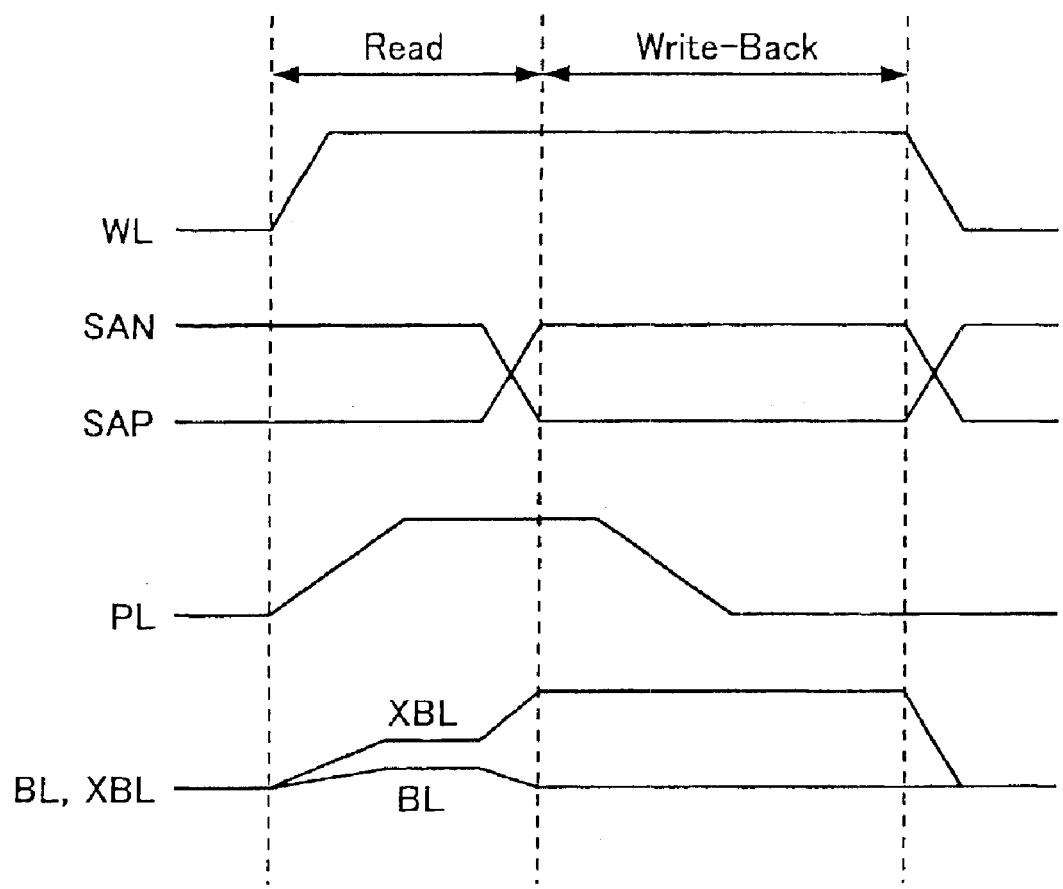
FIG. 3 is a waveform diagram showing a readout operation when the conventional ferroelectric memory shown in FIG. 1 adopts a plate-line drive readout method.
Figure 4:
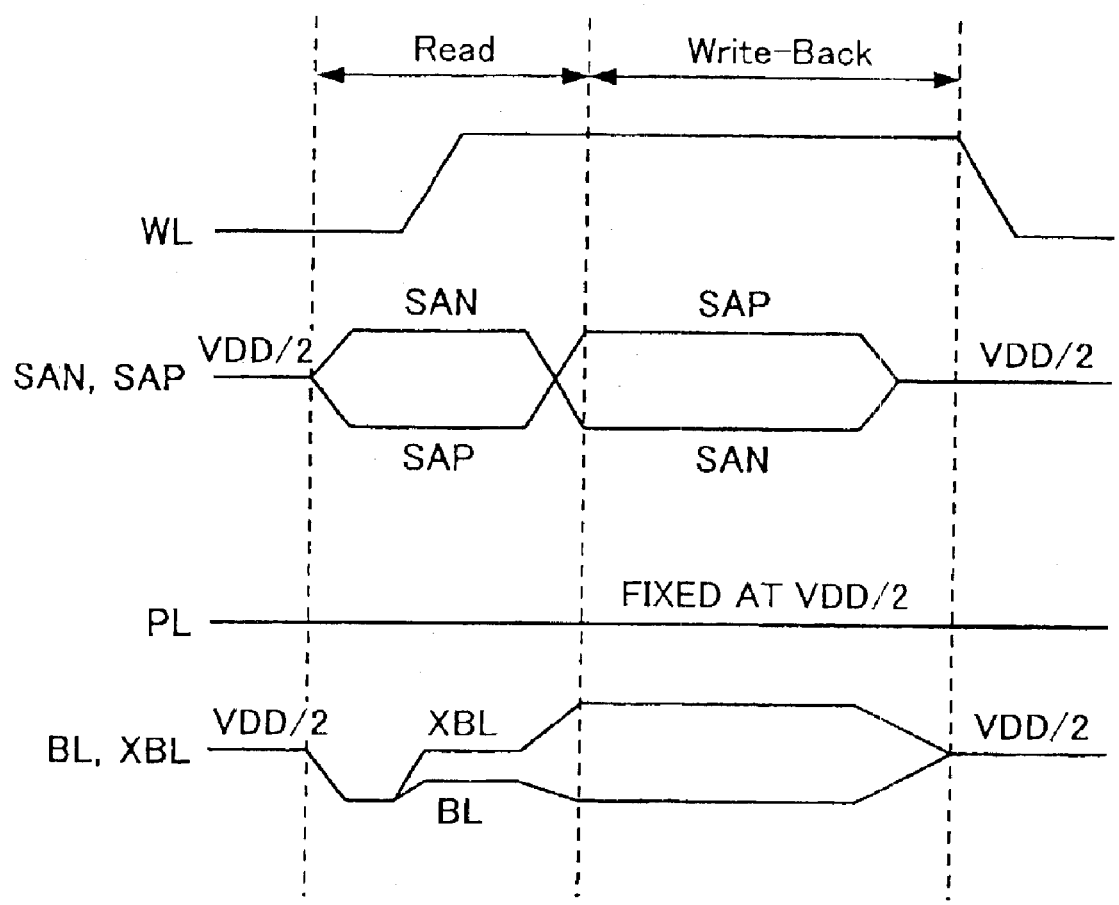
FIG. 4 is a waveform diagram showing a readout operation when the conventional ferroelectric memory shown in FIG. 1 adopts a plate-line non-drive readout method.
Figure 5:
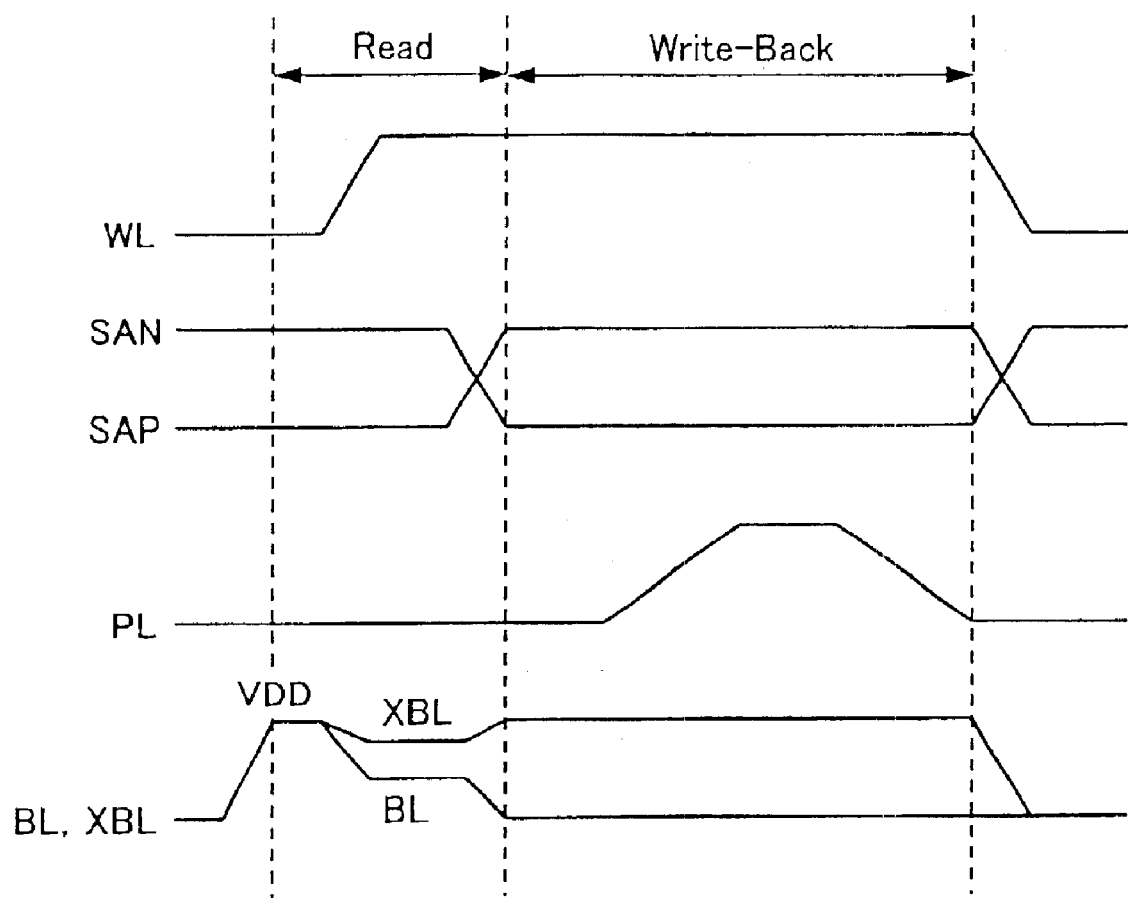
FIG. 5 is a waveform diagram showing a readout operation when the conventional ferroelectric memory shown in FIG. 1 adopts a bit-line drive readout method.

A description will now be given, with reference to FIG. 6 to FIG. 13, of first and second embodiments according to the present invention. Elements in FIG. 6 that correspond to the elements shown in FIG. 1 are referenced by the same reference marks, and will not be described again in detail.

<Embodiment 1 (FIG. 6 to FIG. 9)

Figure 6:
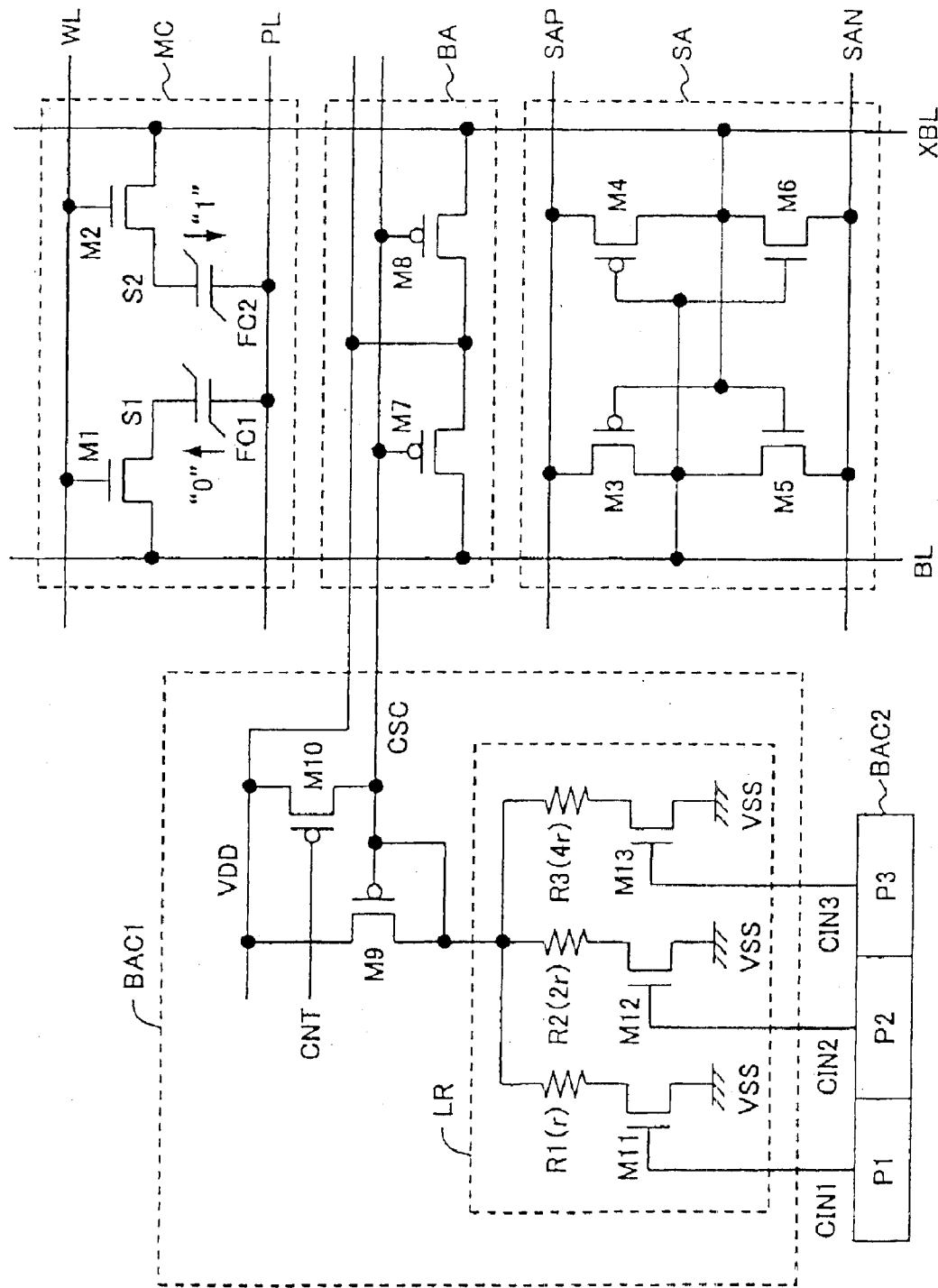
FIG. 6 is a circuit diagram showing a main part of a first embodiment of the present invention.

FIG. 6 is a circuit diagram showing a main part of the first embodiment of the present invention. The present first embodiment is an application of the present invention to a ferroelectric memory including a 2T2C-type memory cell. The ferroelectric memory according to the present first embodiment comprises a direct-current bias electricity supply circuit BA, a direct-current bias electricity supply control circuit BAC1, and a direct-current bias electricity amount control circuit BAC2, with the rest of the main part being structured in a similar manner as in the conventional ferroelectric memory shown in FIG. 1.

The direct-current bias electricity supply circuit BA supplies an equal amount of direct-current bias electricity to the bit lines BL and XBL, after the potential of the word line WL is made VDD so that the nMOS transistors M1 and M2 are turned ON, and before the sense amplifier SA is activated, upon reading data from the memory cell MC. The direct-current bias electricity supply circuit BA includes pMOS transistors M7 and M8 (first and second transistors) forming current sources. A current source control line CSC is provided for controlling gate voltages of the pMOS transistors M7 and M8.

A source of the pMOS transistor M7 is connected to a VDD power supply line, a drain of the pMOS transistor M7 is connected to the bit line BL, and a gate of the pMOS transistor M7 is connected to the current source control line CSC. A source of the pMOS transistor M8 is connected to the VDD power supply line, a drain of the pMOS transistor M8 is connected to the bit line XBL, and a gate of the pMOS transistor M8 is connected to the current source control line CSC.

The direct-current bias electricity supply control circuit BAC1 controls the supply of the direct-current bias electricity to the bit lines BL and XBL by controlling the gate voltages of the pMOS transistors M7 and M8. The direct-current bias electricity supply control circuit BAC1 includes a pMOS transistor M9 (a third transistor) composing a current mirror circuit together with the pMOS transistors M7 and M8. A source of the pMOS transistor M9 is connected to the VDD power supply line, and a gate of the pMOS transistor M9 is connected to a drain thereof and the gates of the pMOS transistors M7 and M8 via the current source control line CSC. Generally, these pMOS transistors M7 to M9 have a same size.

Besides, the direct-current bias electricity supply control circuit BAC1 includes a pMOS transistor M10 (composing a switch part) that is controlled to turn ON/OFF by a control signal CNT. A source of the pMOS transistor M10 is connected to the VDD power supply line, a drain of the pMOS transistor M10 is connected to the current source control line CSC (that is connected to the gate of the pMOS transistor M9), and the control signal CNT is applied to a gate of the pMOS transistor M10.

Further, the direct-current bias electricity supply control circuit BAC1 includes a load circuit LR for the pMOS transistor M9, in which resistances are variable by control signals CIN1 to CIN3. Specifically, the load circuit LR includes a resistor R1 has a resistance of rΩ, a resistor R2 has a resistance of 2rΩ, and a resistor R3 has a resistance of 4rΩ.

The load circuit LR also includes an nMOS transistor M11 that is controlled to turn ON/OFF by the control signal CIN1, an nMOS transistor M12 that is controlled to turn ON/OFF by the control signal CIN2, and an nMOS transistor M13 that is controlled to turn ON/OFF by the control signal CIN3.

One end of the resistor R1 is connected to the drain of the pMOS transistor M9, and the other end of the resistor R1 is connected to a VSS grounding line via the nMOS transistor M11. One end of the resistor R2 is connected to the drain of the pMOS transistor M9, and the other end of the resistor R2 is connected to the VSS grounding line via the nMOS transistor M12. One end of the resistor R3 is connected to the drain of the pMOS transistor M9, and the other end of the resistor R3 is connected to the VSS grounding line via the nMOS transistor M13.

In the heretofore-described structure, when the control signal CNT is made VSS, for example, the pMOS transistor M10 turns ON. Consequently, a potential of the current source control line CSC becomes VDD so that the pMOS transistors M7 and M8 turn OFF. On the other hand, when the control signal CNT is made VDD, the pMOS transistor M10 turns OFF. Consequently, the pMOS transistors M7 to M9 operate as the current mirror circuit.

In this case, when the control signals CIN1 and CIN2 are made VDD, and the control signal CIN3 is made VSS, for example, the nMOS transistors M11 and M12 turn ON, and the nMOS transistor M13 turns OFF so that a current flowing to the pMOS transistor M9 becomes (VDD−|Vth−p|) (1/r+1/2r). Vth−p is a threshold voltage of the pMOS transistor M9. Consequently, currents flowing to the bit lines BL and XBL via the pMOS transistors M7 and M8, respectively, also become (VDD−|Vth−p|) (1/r+1/2r).

The direct-current bias electricity amount control circuit BAC2 controls the amount of the direct-current bias electricity supplied to the bit lines BL and XBL via the pMOS transistors M7 and M8 by supplying the control signals CIN1 to CIN3 to the direct-current bias electricity supply control circuit BAC1. The direct-current bias electricity amount control circuit BAC2 includes a CIN1 generating circuit P1 generating the control signal CIN1, a CIN2 generating circuit P2 generating the control signal CIN2, and a CIN3 generating circuit P3 generating the control signal CIN3. Besides, direct-current bias electricity amount control circuit BAC2 forms a storage circuit as follows.

Figure 7:
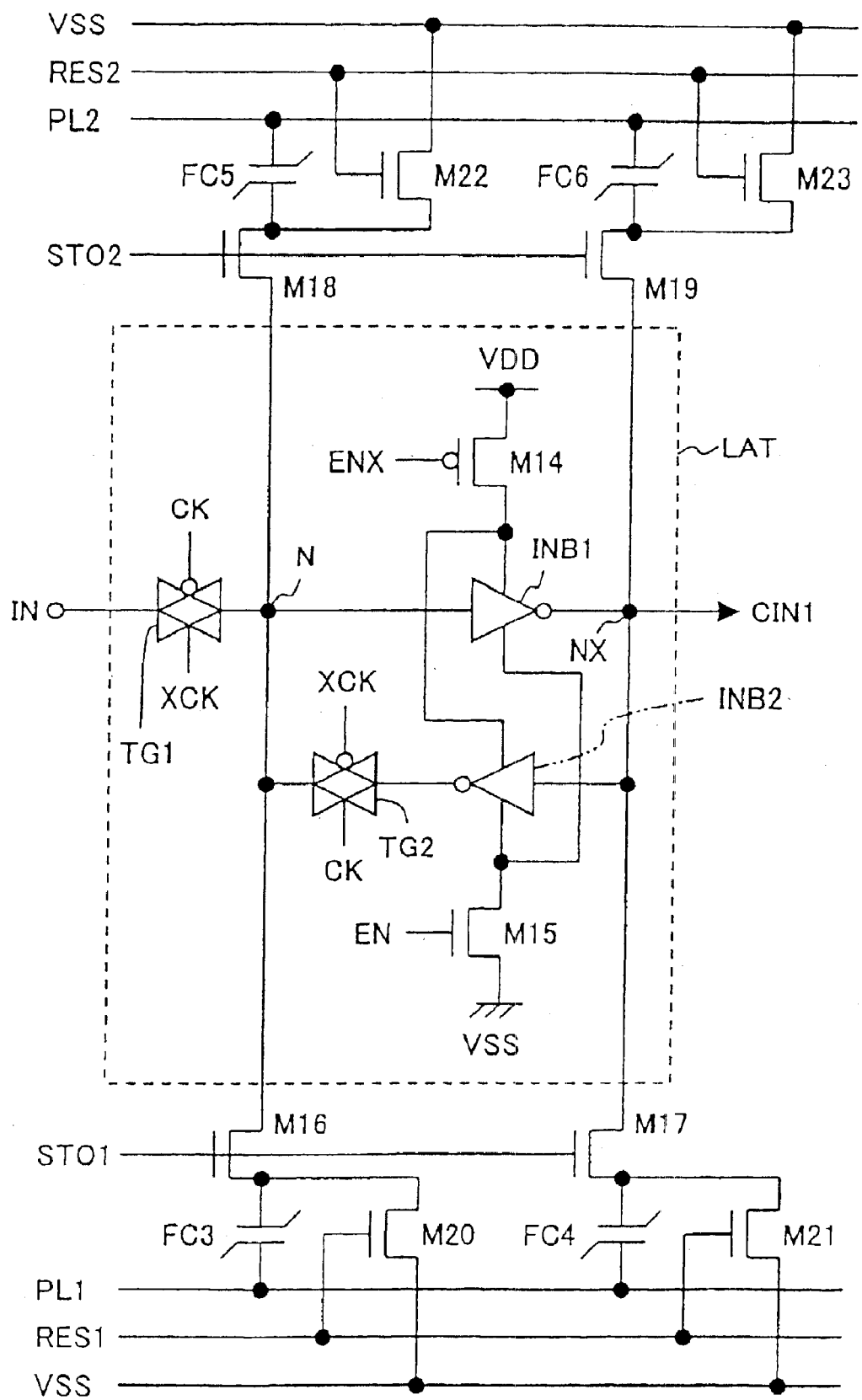
FIG. 7 is a circuit diagram showing an example of a composition of a CIN1 generating circuit included in a direct-current bias electricity amount control circuit provided in the first embodiment of the present invention.

Specifically, the CIN1 generating circuit P1 may be composed of a nonvolatile latch circuit as shown in FIG. 7. The CIN2 generating circuit P2 and the CIN3 generating circuit P3 can be composed similarly. As shown in FIG. 7, this composition includes an input terminal IN and a latch circuit LAT. The latch circuit LAT includes transmission gate circuits TG1 and TG2 that are controlled to turn ON/OFF by clocks CK and XCK, and inverters INB1 and INB2.

The input terminal IN is connected to an input terminal of the inverter INB1 via the transmission gate circuit TG1 and a node N, an output terminal of the inverter INB1 is connected to an input terminal of the inverter INB2, and an output terminal of the inverter INB2 is connected to the input terminal of the inverter INB1 via the transmission gate circuit TG2, thereby obtaining the control signal CIN1 at a node NX.

The latch circuit LAT also includes a pMOS transistor M14 that is controlled to turn ON/OFF by an inverted enable signal ENX. A source of the pMOS transistor M14 is connected to the VDD power supply line, a drain of the pMOS transistor M14 is connected to VDD power supply terminals of the inverters INB1 and INB2, and the inverted enable signal ENX is impressed to a gate of the pMOS transistor M14.

The latch circuit LAT also includes an nMOS transistor M15 that is controlled to turn ON/OFF by an enable signal EN. A source of the nMOS transistor M15 is connected to the VSS grounding line, a drain of the nMOS transistor M15 is connected to VSS grounding terminals of the inverters INB1 and INB2, and the enable signal EN is impressed to a gate of the nMOS transistor M15.

Besides, the composition shown in FIG. 7 also includes ferroelectric capacitors FC3 to FC6 forming storage media, nMOS transistors M16 and M17 that are controlled to turn ON/OFF by a store signal STO1, and nMOS transistors M18 and M19 that are controlled to turn ON/OFF by a store signal, STO2. Alternatively, transmission gate circuits composed of an nMOS transistor and a pMOS transistor may be used in place of the nMOS transistors M16 to M19.

One electrode of the ferroelectric capacitor FC3 is connected to a plate line PL1, and the other electrode of the ferroelectric capacitor FC3 is connected to the node N via the nMOS transistor M16. One electrode of the ferroelectric capacitor FC4 is connected to the plate line PL1, and the other electrode of the ferroelectric capacitor FC4 is connected to the node NX via the nMOS transistor M17.

One electrode of the ferroelectric capacitor FC5 is connected to a plate line PL2, and the other electrode of the ferroelectric capacitor FC5 is connected to the node N via the nMOS transistor M18. One electrode of the ferroelectric capacitor FC6 is connected to the plate line PL2, and the other electrode of the ferroelectric capacitor FC6 is connected to the node NX via the nMOS transistor M19.

Besides, the composition shown in FIG. 7 also includes an nMOS transistor M20 that is controlled to turn ON/OFF by a reset signal RES1. A source of the nMOS transistor M20 is connected to the VSS grounding line, a drain of the nMOS transistor M20 is connected to the other electrode of the ferroelectric capacitor FC3, and the reset signal RES1 is impressed to a gate of the nMOS transistor M20.

The composition shown in FIG. 7 also includes an nMOS transistor M21 that is controlled to turn ON/OFF by the reset signal RES1. A source of the nMOS transistor M21 is connected to the VSS grounding line, a drain of the nMOS transistor M21 is connected to the other electrode of the ferroelectric capacitor FC4, and the reset signal RES1 is impressed to a gate of the nMOS transistor M21.

The composition shown in FIG. 7 also includes an nMOS transistor M22 that is controlled to turn ON/OFF by a reset signal RES2. A source of the nMOS transistor M22 is connected to the VSS grounding line, a drain of the nMOS transistor M22 is connected to the other electrode of the ferroelectric capacitor FC5, and the reset signal RES2 is impressed to a gate of the nMOS transistor M22.

The composition shown in FIG. 7 also includes an nMOS transistor M23 that is controlled to turn ON/OFF by the reset signal RES2. A source of the nMOS transistor M23 is connected to the VSS grounding line, a drain of the nMOS transistor M23 is connected to the other electrode of the ferroelectric capacitor FC6, and the reset signal RES2 is impressed to a gate of the nMOS transistor M23.

Figure 8:
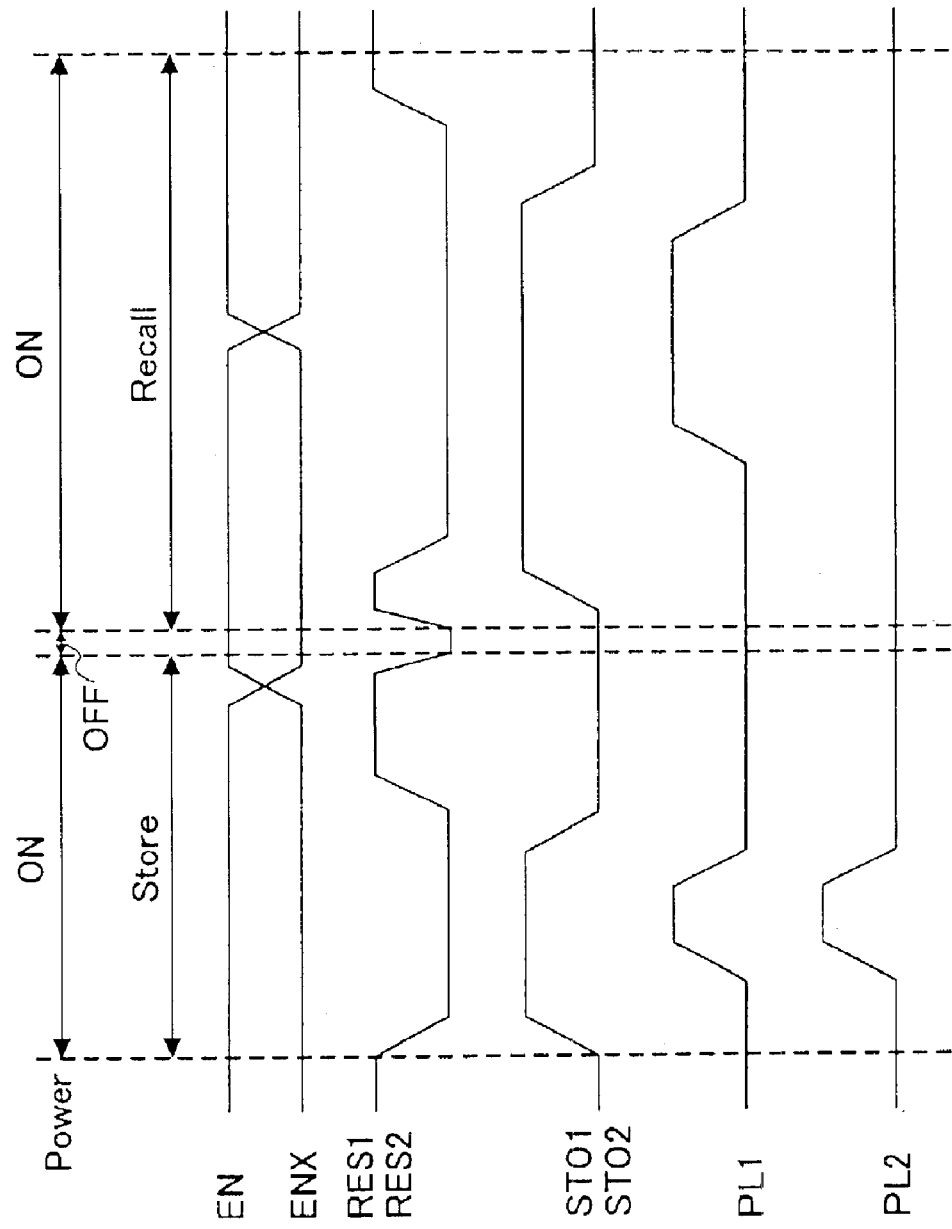
FIG. 8 is a waveform diagram showing a storing operation and a recalling operation of the CIN1 generating circuit shown in FIG. 7.

FIG. 8 is a waveform diagram showing a storing operation (Store) and a recalling operation (Recall) of the CIN1 generating circuit P1 shown in FIG. 7. In the present description, "store" means storing potentials of the nodes N and NX in the ferroelectric capacitors before a power-off (a cutoff of the power supply), and "recall" means restoring the nodes N and NX to the, potentials before the power-off, after a power-on (an application of the power supply).

Upon storing, in a state where the inverted enable signal ENX is VSS, and the enable signal EN is VDD so that the latch circuit LAT is active, the reset signals RES1 and RES2 are made VSS so that the nMOS transistors M20 to M23 are turned OFF. Additionally, the store signals STO1 and STO2 are made VDD so that the nMOS transistors M16 to M19 are turned ON.

In this state, potentials of the plate lines PL1 and PL2 are changed from VSS through VDD to VSS. Consequently, the ferroelectric capacitors FC3 and FC5 store data corresponding to the potential of the node N, and the ferroelectric capacitor FC4 and FC6 store data corresponding to the potential of the node NX.

Upon recalling, the inverted enable signal ENX is made VDD, and the enable signal EN is made VSS so that the latch circuit LAT is deactivated. Additionally, the reset signals RES1 and RES2 are made VSS so that the nMOS transistors M20 to M23 are turned OFF. Before the reset signals RES1 and RES2 are made VSS, the store signals STO1 and STO2 are made VDD so that the nMOS transistors M16 to M19 are turned ON; thereby the nodes N and NX are precharged beforehand at the grounding voltage VSS.

In this state, while the potential of the plate line PL2 is maintained at VSS, the potential of the plate line PL2 is changed from VSS through VDD to VSS. Consequently, the potentials of the nodes N and NX rise so that a differential voltage occurs between the nodes N and NX.

Then, the inverted enable signal ENX is made VSS, and the enable signal EN is made VDD so that the pMOS transistor M14 is turned ON, and the nMOS transistor M15 is turned ON. Consequently, the latch circuit LAT is activated, and the differential voltage between the nodes N and NX is amplified so that the potentials of the nodes N and NX become the respective potentials (the potentials before the power-off) corresponding to the data stored in the ferroelectric capacitors FC3 to FC6 upon storing.

That is, after an application of the power supply, in a state where the nMOS transistors M16 to M19 are OFF, and the nMOS transistors M20 to M23 are ON, when data "0" is supplied from the input terminal IN, for example, the potential of the node N becomes VSS, and the potential of the node NX becomes VDD so that the control signal CIN1 becomes VDD.

In a power-off process transiting from this state, data "0" is stored in the ferroelectric capacitors FC3 and FC5, and data "1" is stored in the ferroelectric capacitors FC4 and FC6, by the storing operation. Then, upon an application of the power supply, the potential of the node N is made VSS that is the potential before the power-off, and the potential of the node NX is made VDD that is the potential before the power-off, by the recalling operation.

Therefore, according to the present first embodiment, when the amount of the direct-current bias electricity to be supplied to the bit lines BL and XBL needs to be changed according to variations in a manufacturing process, the amount of the direct-current bias electricity can be changed by supplying predetermined data to the direct-current bias electricity amount control circuit BAC2 from outside, and thereby changing logical values of the control signals CIN1 to CIN3.

Besides, the direct-current bias electricity amount control circuit BAC2 may not only use the nonvolatile latch circuit shown in FIG. 7 which includes the ferroelectric capacitors, but also use a nonvolatile flip-flop circuit using ferroelectric capacitors, a nonvolatile SRAM circuit using ferroelectric capacitors, and a nonvolatile shift register composed of a nonvolatile latch circuit or a nonvolatile flip-flop circuit using ferroelectric capacitors. These elements can be realized by applying the nonvolatile latch circuit shown in FIG. 7.

Figure 9:
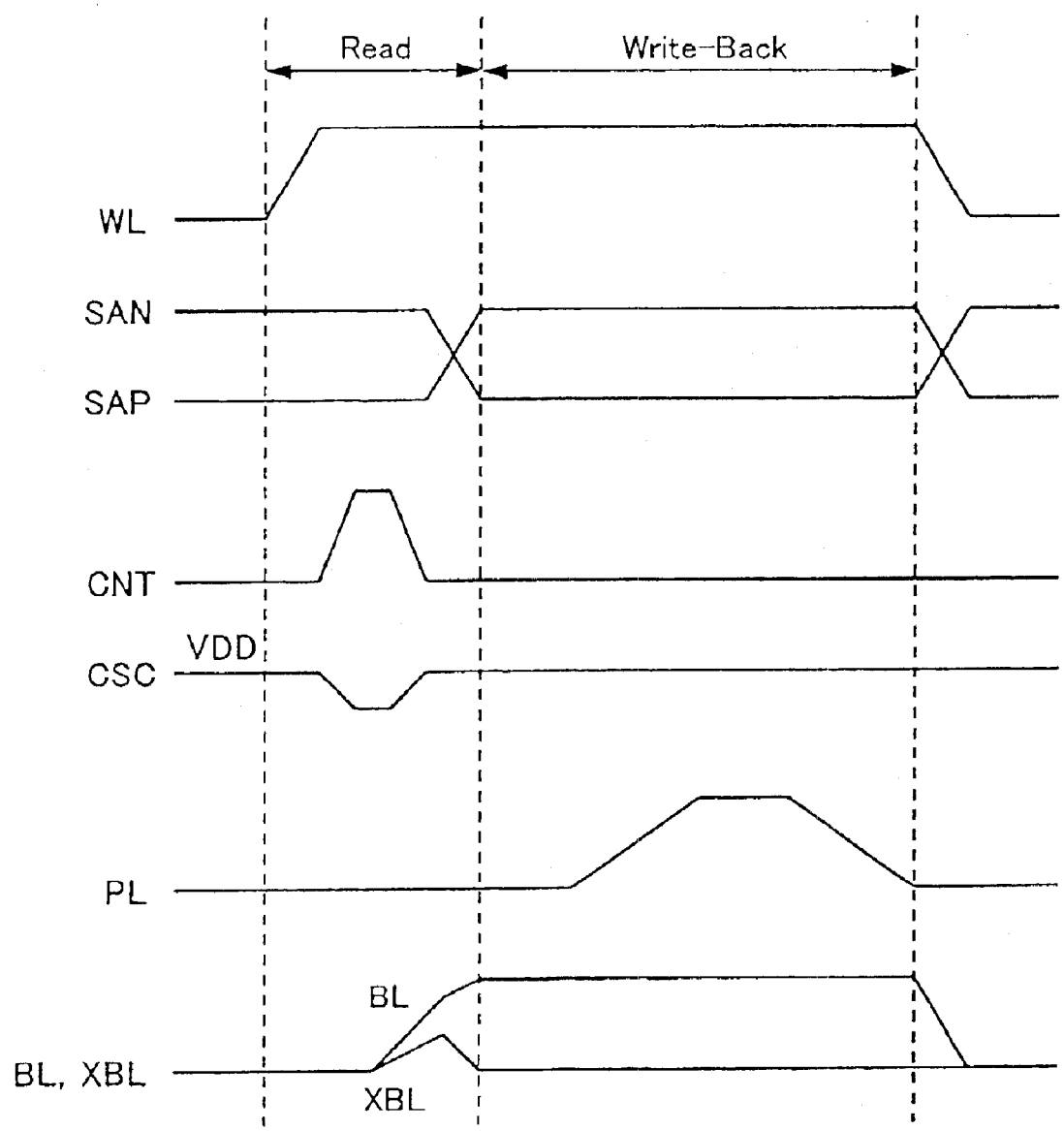
FIG. 9 is a waveform diagram showing a readout method of a plate-line non-drive/capacitance-difference detection type adopted in the first embodiment of the present invention.

FIG. 9 is a waveform diagram exemplifying a readout method of a plate-line non-drive/capacitance-difference detection type adopted in the present first embodiment. In an example shown in FIG. 9, the memory cell MC is selected in a case where data "0" is stored in the ferroelectric capacitor FC1, and data "1" is stored in the ferroelectric capacitor FC2.

In this readout method, prior to a readout (Read) period, the potential of the word line WL is VSS so that the nMOS transistors M1 and M2 are OFF. Also, the potential of the sense amplifier drive voltage line SAP is VSS, and the potential of the sense amplifier drive voltage line SAN is VDD so that the sense amplifier SA is inactive.

Besides, the control signal CNT is VSS so that the pMOS transistor M10 is ON, that the potential of the current source control line CSC is VDD, and that the pMOS transistors M7 and M8 are OFF. Further, the potential of the plate line PL is VSS, and the bit lines BL and XBL are precharged at VSS.

In the readout period, the potential of the word line WL is made VDD so that the nMOS transistors M1 and M2 are turned ON. Thereafter, the control signal CNT is made VDD so that the pMOS transistor M10 is turned OFF. Consequently, the pMOS transistors M7 to M9 compose the current mirror circuit.

Accordingly, the same amount of the direct-current bias electricity as the amount flowing to the pMOS transistor M9 is supplied to the bit lines BL and XBL via the pMOS transistors M7 and M8, respectively, so that the potentials of the bit lines BL and XBL rise slightly. In the present example, the data "0" is stored in the ferroelectric capacitor FC1, and the data "1" is stored in the ferroelectric capacitor FC2; accordingly, due to a difference between the effective capacitances of the ferroelectric capacitors FC1 and FC2, the potential of the bit line BL becomes smaller than the potential of the bit line XBL.

Then, the potential of the sense amplifier drive voltage line SAP is made VDD, and the potential of the sense amplifier drive voltage line SAN is made VSS so that the sense amplifier SA is activated. Consequently, the potential of the bit line BL is pulled up to VDD, and the potential of the bit line XBL is pulled down to VSS.

In this state, a write-back (Write-Back) period follows the readout period. In the write-back period, the potential of the plate line PL is pulled down to VSS, up to VDD, and down to VSS, and a write-back is performed to the ferroelectric capacitors FC1 and FC2.

When the write-back period finishes, the potential of the word line WL is made VSS so that the nMOS transistors M1 and M2 are turned OFF. Also, the potential of the sense amplifier drive voltage line SAP is made VSS, and the potential of the sense amplifier drive voltage line SAN is made VDD so that the sense amplifier SA is deactivated. Further, the bit lines BL and XBL are precharged at VSS.

As described above, according to the present first embodiment, upon performing a readout of data from the memory cell MC, the bit lines BL and XBL are precharged beforehand at the grounding voltage VSS; and, at a start of the readout, the equal amount of the direct-current bias electricity is supplied to the bit lines BL and XBL for a predetermined period of time by the direct-current bias electricity supply circuit BA; thereafter the sense amplifier SA is activated, thereby performing the readout of data from the memory cell MC.

Thus, the plate line PL does not need to be driven upon reading data from the memory cell MC; therefore, the ferroelectric memory including the 2T2C-type memory cell MC is capable of performing the readout at high speed. Further, the boosted voltage VPP boosted from the power supply voltage VDD does not need to be supplied to the word line WL, and accordingly, a boosting circuit does not need to be provided, thereby avoiding an increase in circuit scale.

<Embodiment 2 (FIG. 10 to FIG. 13)

Figure 10:
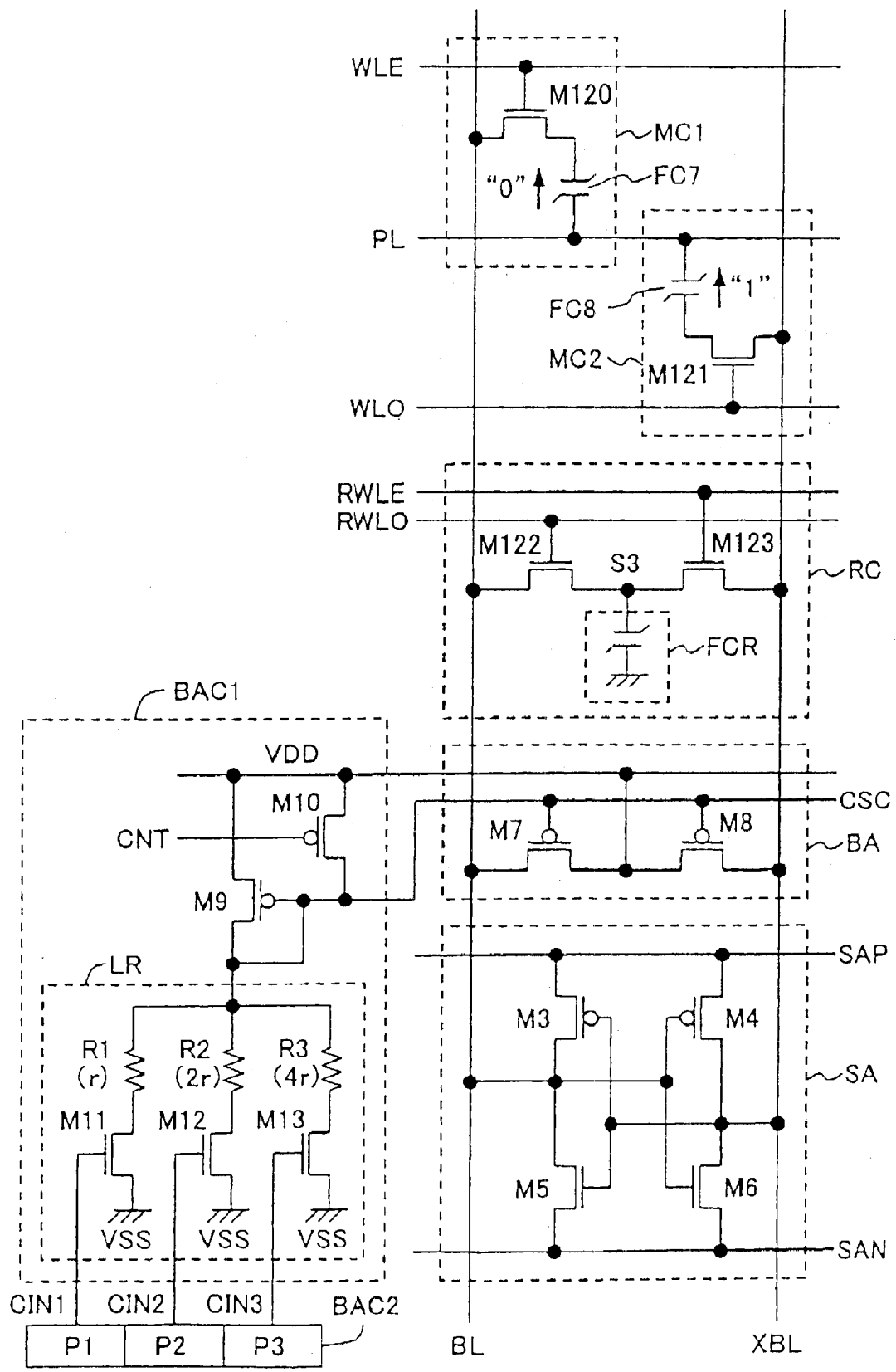
FIG. 10 is a circuit diagram showing a main part of a second embodiment of the present invention.

FIG. 10 is a circuit diagram showing a main part of the second embodiment of the present invention. The present second embodiment is an application of the present invention to a ferroelectric memory including 1T1C-type memory cells. The ferroelectric memory according to the present second embodiment comprises the direct-current bias electricity supply circuit BA, the direct-current bias electricity supply circuit BAC1 and the direct-current bias electricity amount control circuit BAC2 for the bit lines BL and XBL, as in the foregoing first embodiment.

FIG. 10 shows word lines WLE and WLO, a plate line PL, and 1T1C-type memory cells MC1 and MC2. The 1T1C-type memory cells MC1 and MC2 respectively include ferroelectric capacitors FC7 and FC8 of a same size, and nMOS transistors M120 and M121 forming access transistors. FIG. 10 also shows reference word lines RWLE and RWLO, and a reference cell RC. The reference cell RC includes a ferroelectric capacitor circuit FCR, and nMOS transistors M122 and M123 forming access transistors.

Figure 11:
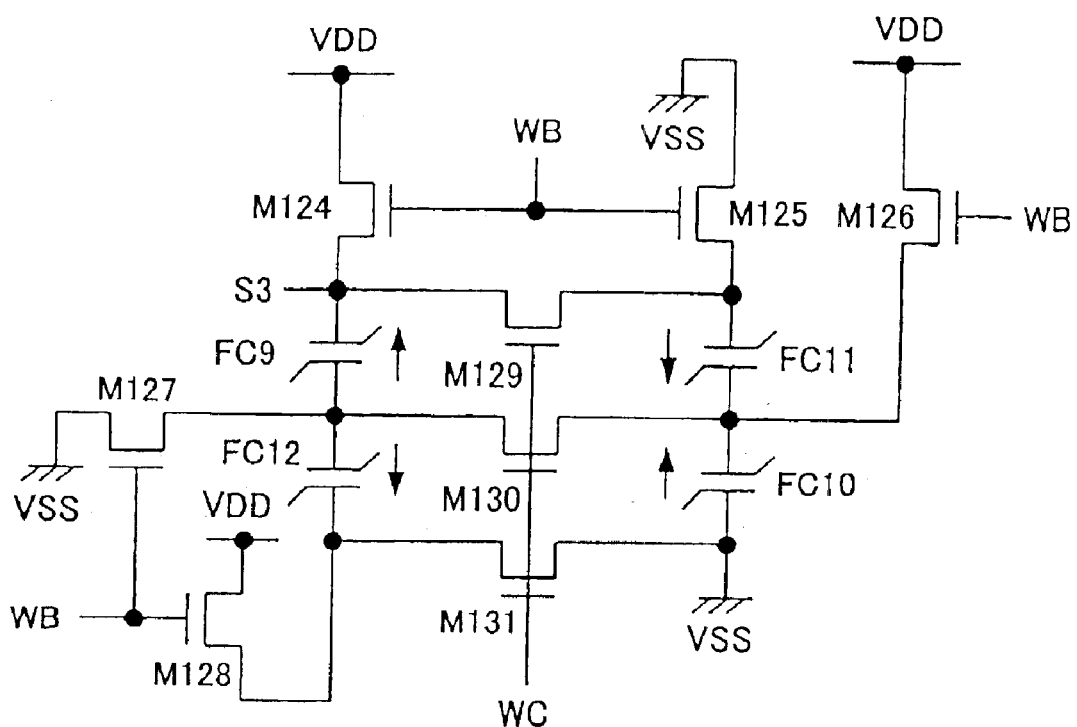
FIG. 11 is a circuit diagram showing a structure of a ferroelectric capacitor circuit provided in the second embodiment of the present invention.

FIG. 11 is a circuit diagram showing a structure of the ferroelectric capacitor circuit FCR shown in FIG. 10. FIG. 11 shows ferroelectric capacitors FC9 to FC12 (first, second, third and fourth ferroelectric capacitors) of the same size as the ferroelectric capacitors FC7 and FC8, nMOS transistors M124 to M128 controlled to turn ON/OFF by a control signal WB, and nMOS transistors M129 to M131 controlled to turn ON/OFF by a control signal WC. Besides, at least the nMOS transistors M124 to M131 form a connection part.

In this structure, when the control signal WB is made VDD, and the control signal WC is made VSS, the nMOS transistors M124 to M128 turn ON, and the nMOS transistors M129 to M131 turn OFF so that data "0" is stored in the ferroelectric capacitors FC9 and FC10, and data "1" is stored in the ferroelectric capacitors FC11 and FC12.

Figure 12:
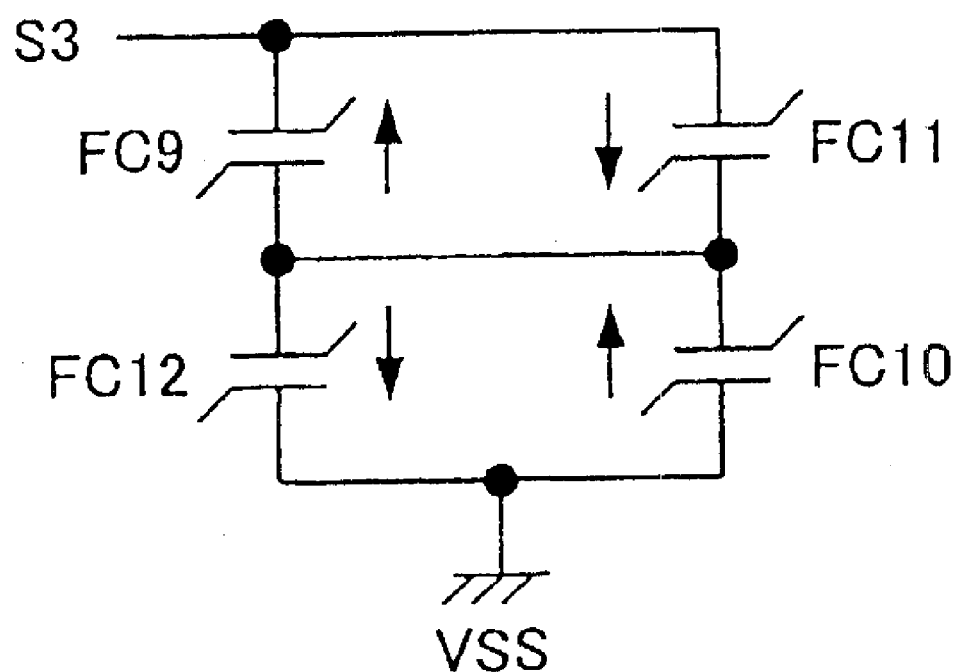
FIG. 12 is a circuit diagram of a ferroelectric capacitor circuit equivalent to the ferroelectric capacitor circuit provided in the second embodiment of the present invention.

Thereafter, when the control signal WB is made VSS, and the control signal WC is made VDD, the nMOS transistors M124 to M128 turn OFF, and the nMOS transistors M129 to M131 turn ON so that the ferroelectric capacitor circuit FCR shown in FIG. 11 becomes equivalent to a circuit consisting only of the ferroelectric capacitors FC9 to FC12, as shown in FIG. 12. As shown in FIG. 12, the ferroelectric capacitors FC9 and FC11 are connected in parallel, composing a first parallel circuit. The ferroelectric capacitors FC10 and FC12 are connected in parallel, composing a second parallel circuit. The first parallel circuit and the second parallel circuit are connected in series.

In the circuit shown in FIG. 12, assuming that a capacitance of the ferroelectric capacitors FC9 and FC10 storing data "1" is C1 and that a capacitance of the ferroelectric capacitors FC11 and FC12 storing data "0" is C0, a synthetic capacitance of the ferroelectric capacitors FC9 to FC12 becomes (C1+C0)/2. That is, the ferroelectric capacitor circuit FCR becomes equivalent to a ferroelectric capacitor having an intermediate value between the data "1" and the data "0".

In the present second embodiment, the control signal WB is made VSS, and the control signal WC is made VDD, when a potential of the plate line PL is made VSS in a case where the word line WLE and the reference word line RWLE are selected, or the word line WLO and the reference word line RWLO are selected.

On the other hand, the control signal WB is made VDD, and the control signal WC is made VSS, when the potential of the plate line PL is made VDD in a case where the word line WLE and the reference word line RWLE are selected, or the word line WLO and the reference word line RWLO are selected.

Figure 13:
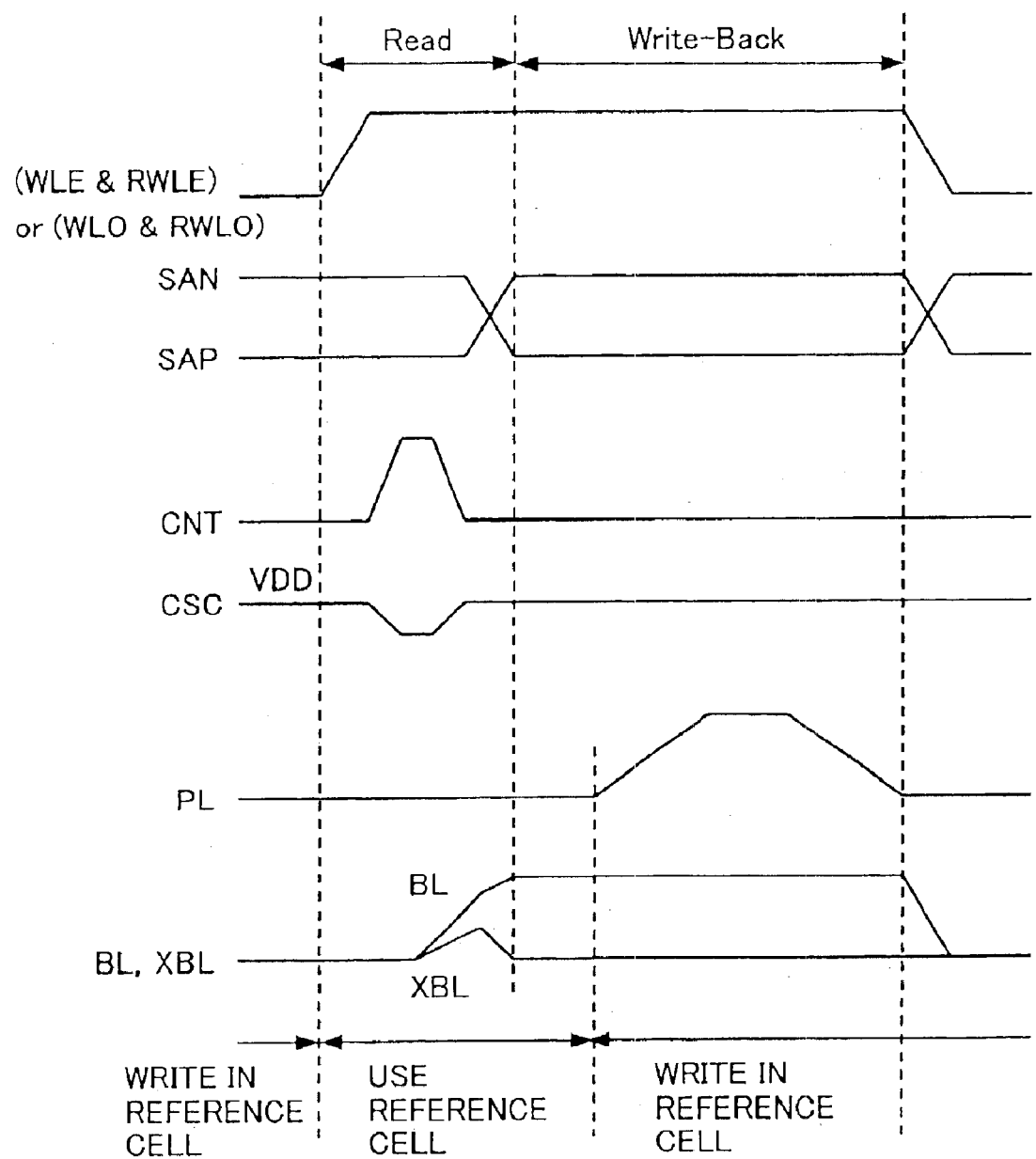
FIG. 13 is a waveform diagram showing a readout method of a plate-line non-drive/capacitance-difference detection type adopted in the second embodiment of the present invention.

FIG. 13 is a waveform diagram exemplifying a readout method of a plate-line non-drive/capacitance-difference detection type adopted in the present second embodiment. In an example shown in FIG. 13, data "0" is stored in the ferroelectric capacitor FC7, and data "1" is stored in the ferroelectric capacitor FC8.

In this readout method, prior to a readout (Read) period, potentials of the word lines WLE and WLO are VSS so that the nMOS transistors M120 and M121 are OFF. Besides, potentials of the reference word lines RWLE and RWLO are VSS so that the nMOS transistors M122 and M123 are OFF. Also, the potential of the sense amplifier drive voltage line SAP is VSS, and the potential of the sense amplifier drive voltage line SAN is VDD so that the sense amplifier SA is inactive.

Besides, the control signal CNT is VSS so that the pMOS transistor M10 is ON, that the potential of the current source control line CSC is VDD, and that the pMOS transistors M7 and M8 are OFF. Further, the potential of the plate line PL is VSS, and the bit lines BL and XBL are precharged at VSS.

In the readout period, when the memory cell MC1 is selected, for example, the potential of the word line WLE is made VDD so that the nMOS transistor M120 is turned ON. Besides, the potential of the reference word line RWLE is made VDD so that the nMOS transistor M123 is turned ON.

Thereafter, the control signal CNT is made VDD so that the pMOS transistor M10 is turned OFF. Consequently, the pMOS transistors M7 to M9 compose the current mirror circuit. Accordingly, the same amount of the direct-current bias electricity as the amount flowing to the pMOS transistor M9 is supplied to the bit lines BL and XBL via the pMOS transistors M7 and M8, respectively, so that the potentials of the bit lines BL and XBL rise slightly.

In the present example, the data "0" is stored in the ferroelectric capacitor FC7, and the ferroelectric capacitor circuit FCR is equivalent to the ferroelectric capacitor having the intermediate value between the data "1" and the data "0"; accordingly, due to a difference between the effective capacitances of the ferroelectric capacitor FC7 and the ferroelectric capacitor equivalent to the ferroelectric capacitor circuit FCR, the potential of the bit line BL becomes smaller than the potential of the bit line XBL.

Then, the potential of the sense amplifier drive voltage line SAP is made VDD, and the potential of the sense amplifier drive voltage line SAN is made VSS so that the sense amplifier SA is activated. Consequently, the potential of the bit line BL is pulled up to VDD, and the potential of the bit line XBL is pulled down to VSS.

In this state, a write-back (Write-Back) period follows the readout period. In the write-back period, the potential of the plate line PL is pulled down to VSS, up to VDD, and down to VSS, and a write-back is performed to the ferroelectric capacitor FC7, and a writing is performed to the ferroelectric capacitors FC9 to FC12.

When the write-back period finishes, the potential of the word line WLE is made VSS so that the nMOS transistor M120 is turned OFF. Besides, the potential of the reference word line RWLE is made VSS so that the nMOS transistor M123 is turned OFF. Also, the potential of the sense amplifier drive voltage line SAP is made VSS, and the potential of the sense amplifier drive voltage line SAN is made VDD so that the sense amplifier SA is deactivated. Further, the bit lines BL and XBL are precharged at VSS. Besides, a readout of data from the memory cell MC2 is similarly performed by driving the word line WLO and the reference word line RWLO.

As described above, according to the present second embodiment, upon performing a readout of data from the memory cell MC1 or the memory cell MC2, the bit lines BL and XBL are precharged beforehand at the grounding voltage VSS; and, at a start of the readout, the equal amount of the direct-current bias electricity is supplied to the bit lines BL and XBL for a predetermined period of time by the direct-current bias electricity supply circuit BA; thereafter the sense amplifier SA is activated, thereby performing the readout of data from the memory cell MC1 or the memory cell MC2.

Thus, the plate line PL does not need to be driven upon reading data from the memory cell MC1 or the memory cell MC2; therefore, the ferroelectric memory including the 1T1C-type memory cells is capable of performing the readout at high speed. Further, the boosted voltage VPP boosted from the power supply voltage VDD does not need to be supplied to the word lines WLE and WLO and the reference word lines RWLE and RWLO, and accordingly, a boosting circuit does not need to be provided, thereby avoiding an increase in circuit scale.

Additionally, according to the present second embodiment, upon performing a readout, the ferroelectric capacitor circuit FCR becomes equivalent to the ferroelectric capacitor having the intermediate value between the data "1" and the data "0"; therefore, an operational margin can be enlarged.

Besides, similar advantages as described above can be achieved by providing a ferroelectric capacitor circuit as follows: upon performing a write-back of data to the memory cell MC1 or MC2, data "1" is written to the ferroelectric capacitors FC9 and FC10, and data "0" is written to the ferroelectric capacitors FC11 and FC12; and upon performing a readout of data from the memory cell MC1 or the memory cell MC2, the ferroelectric capacitors FC9 and FC10 are connected in series, and the ferroelectric capacitors FC11 and FC12 are connected in series, wherein a first series circuit composed of the ferroelectric capacitors FC9 and FC10 and a second series circuit composed of the ferroelectric capacitors FC11 and FC12 are connected in parallel.

The present invention is not limited to the specifically disclosed embodiments, and variations and modifications may be made without departing from the scope of the present invention.

The present application is based on Japanese priority application No. 2002-162651 filed on Jun. 4, 2002, the entire contents of which are hereby incorporated by reference.

What is claimed is:

1. A ferroelectric memory comprising:
   a memory cell;
   first and second bit lines corresponding to said memory cell;
   a sense amplifier corresponding to said first and second bit lines; and
   a direct-current bias electricity supply circuit supplying a predetermined amount of direct-current bias electricity to said first and second bit lines for a predetermined period of time upon reading data from said memory cells;
   wherein, upon reading data from said memory cell, said first and second bit lines are precharged beforehand at a grounding voltage, said predetermined amount of direct-current bias electricity is supplied to said first and second bit lines for said predetermined period of time by said direct-current bias electricity supply circuit at a start of the reading, and thereafter said sense amplifier is activated.

2. The ferroelectric memory as claimed in claim 1, wherein said direct-current bias electricity supply circuit comprises:
   a first transistor including a source connected to a power supply line, a drain connected to said first bit line, and a gate having a voltage controlled by a direct-current bias electricity supply control circuit; and
   a second transistor including a source connected to said power supply line, a drain connected to said second bit line, and a gate having a voltage controlled by said direct-current bias electricity supply control circuit.

3. The ferroelectric memory as claimed in claim 2, wherein said direct-current bias electricity supply control circuit comprises:
   a third transistor including a source connected to said power supply line, and a gate connected to a drain thereof, said gate of first transistor and said gate of second transistor;
   a load circuit having one end connected to said drain of said third transistor, and the other end connected to a grounding line; and
   a switch part having one end connected to said power supply line, and the other end connected to said gate of said third transistor, the switch part being controlled to turn ON/OFF by a control signal.

4. The ferroelectric memory as claimed in claim 3, further comprising a storage circuit storing data rewritable from outside,
   wherein said load circuit has load resistances variable according to the data stored in said storage circuit.

5. The ferroelectric memory as claimed in claim 1, further comprising a reference cell circuit including:
   first, second, third and fourth ferroelectric capacitors; and
   a connection part writing data "1" to said first and second ferroelectric capacitors, and writing data "0" to said third and fourth ferroelectric capacitors upon writing data back to said memory cell,
   wherein said connection part connects said first and third ferroelectric capacitors in parallel, connects said second and fourth ferroelectric capacitors in parallel, and connects a first parallel circuit composed of said first and third ferroelectric capacitors and a second parallel circuit composed of said second and fourth ferroelectric capacitors in series upon reading data from said memory cell.

6. The ferroelectric memory as claimed in claim 1, further comprising a reference cell circuit including:
   first, second, third and fourth ferroelectric capacitors; and
   a connection part writing data "1" to said first and second ferroelectric capacitors, and writing data "0" to said third and fourth ferroelectric capacitors upon writing data back to said memory cell,
   wherein said connection part connects said first and second ferroelectric capacitors in series, connects said third and fourth ferroelectric capacitors in series, and connects a first series circuit composed of said first and second ferroelectric capacitors and a second series circuit composed of said third and fourth ferroelectric capacitors in parallel upon reading data from said memory cell.

* * * * *